(12) United States Patent
Nakabayashi et al.

(10) Patent No.: US 10,504,876 B2
(45) Date of Patent: Dec. 10, 2019

(54) LIGHT-EMITTING DEVICE

(71) Applicant: NICHIA CORPORATION, Anan-shi, Tokushima (JP)

(72) Inventors: Takuya Nakabayashi, Tokushima (JP); Tadaaki Ikeda, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/889,677

(22) Filed: Feb. 6, 2018

(65) Prior Publication Data

US 2018/0226385 A1  Aug. 9, 2018

(30) Foreign Application Priority Data

Feb. 9, 2017 (JP) ................................ 2017-022231

(51) Int. Cl.

| H01L 29/18 | (2006.01) |
|---|---|
| H01L 25/075 | (2006.01) |
| H01L 33/60 | (2010.01) |
| H01L 33/50 | (2010.01) |
| H01L 33/54 | (2010.01) |
| H01L 33/62 | (2010.01) |

(52) U.S. Cl.
CPC ........ *H01L 25/0753* (2013.01); *H01L 33/505* (2013.01); *H01L 33/54* (2013.01); *H01L 33/60* (2013.01); *H01L 33/62* (2013.01); *H01L 2933/005* (2013.01); *H01L 2933/0058* (2013.01); *H01L 2933/0066* (2013.01)

(58) Field of Classification Search
CPC .................................................. H01L 25/0753
USPC .......................................................... 257/88
See application file for complete search history.

(56) References Cited

U.S. PATENT DOCUMENTS

| 2011/0303928 A1 | 12/2011 | Kawabata |
| 2012/0235169 A1* | 9/2012 | Seko ...................... H01L 33/60 257/88 |
| 2014/0362570 A1 | 12/2014 | Miyoshi et al. |
| 2015/0021642 A1 | 1/2015 | Nakabayashi |
| 2015/0102366 A1 | 4/2015 | Wada |

(Continued)

FOREIGN PATENT DOCUMENTS

| JP | H02-168634 A | 6/1990 |
| JP | 2010-198919 A | 9/2010 |

(Continued)

*Primary Examiner* — Ajay Arora
(74) *Attorney, Agent, or Firm* — Global IP Counselors, LLP

(57) ABSTRACT

A light-emitting device includes a mounting board, a first light-emitting element, a second light-emitting element and a light-reflective covering member. The mounting board includes first lands and second lands on an upper surface of the mounting board. The first light-emitting element is flip-chip mounted on the first lands. The second light-emitting element is flip-chip mounted on the second lands. The light-reflective covering member covers a lateral surface of the first light-emitting element, a lateral surface of the second light-emitting element, and the upper surface of the mounting board. The mounting board and the light-reflective covering member define a depressed portion between the first light-emitting element and the second light-emitting element with a bottom surface of the depressed portion being located inside the mounting board.

20 Claims, 4 Drawing Sheets

(56) References Cited

U.S. PATENT DOCUMENTS

| | | | |
|---|---|---|---|
| 2015/0340575 A1* | 11/2015 | Nakabayashi | H01L 33/486 257/91 |
| 2015/0380622 A1 | 12/2015 | Miyoshi et al. | |
| 2016/0167949 A1* | 6/2016 | Jiang | B81B 7/0048 257/415 |
| 2016/0204051 A1* | 7/2016 | Cheng | H01L 23/4985 257/738 |
| 2017/0236981 A1 | 8/2017 | Nakabayashi | |

FOREIGN PATENT DOCUMENTS

| | | |
|---|---|---|
| JP | 2011-023447 A | 2/2011 |
| JP | 2013-012544 A | 1/2013 |
| JP | 21013-012545 A | 1/2013 |
| JP | 2013-506985 A | 2/2013 |
| JP | 2014-236175 A | 12/2014 |
| JP | 2015-023162 A | 2/2015 |
| JP | 2015-038963 A | 2/2015 |
| JP | 2015-079805 A | 4/2015 |
| JP | 2016-027620 A | 2/2016 |
| JP | 2016-066680 A | 4/2016 |
| JP | 2016-518713 A | 6/2016 |
| WO | 2011039509 A1 | 4/2011 |
| WO | 2014-167455 A2 | 10/2014 |

* cited by examiner

LIGHT-EMITTING DEVICE

CROSS-REFERENCE TO RELATED APPLICATION

This application claims priority to Japanese Patent Application No. 2017-022231, filed on Feb. 9, 2017, the disclosure of which is hereby incorporated by reference in its entirety.

BACKGROUND

The present disclosure relates to a light-emitting device.
Light-emitting device has been proposed which includes: a plurality of semiconductor light-emitting elements arranged, on a mounting board, with gaps therebetween; phosphor plates provided for the respective semiconductor light-emitting elements; transparent adhesive members that fixedly bond the upper surfaces of the semiconductor light-emitting elements to the lower surfaces of the phosphor plates; and a reflective layer that surrounds the semiconductor light-emitting elements and the phosphor plates and that contains light-reflective fine particles.

The content of Japanese Patent Publication No. 2015-079805 is incorporated herein by reference in its entirety.

SUMMARY

In the above-mentioned light-emitting device, thermal stress is easily accumulated in the reflective layer between two semiconductor light-emitting elements, resulting in the possibility of breakage of the reflective layer and the like.

An embodiment of the present invention has an object to provide a light-emitting device in which breakage of components such as a covering member that has a light reflectivity and covers the peripheries of a plurality of light-emitting elements is less likely to occur.

A light-emitting device according to an embodiment of the present invention includes a mounting board, a first light-emitting element, a second light-emitting element and a light-reflective covering member. The mounting board includes first lands and second lands on an upper surface of the mounting board. The first light-emitting element is flip-chip mounted on the first lands. The second light-emitting element is flip-chip mounted on the second lands. The light-reflective covering member covers a lateral surface of the first light-emitting element, a lateral surface of the second light-emitting element, and the upper surface of the mounting board. The mounting board and the light-reflective covering member define a depressed portion between the first light-emitting element and the second light-emitting element with a bottom surface of the depressed portion being located inside the mounting board.

In a light-emitting device according to an embodiment of the present invention, formation of cracks in a light-reflective covering member and the like is effectively alleviated.

DETAILED DESCRIPTION

Figure 1A:
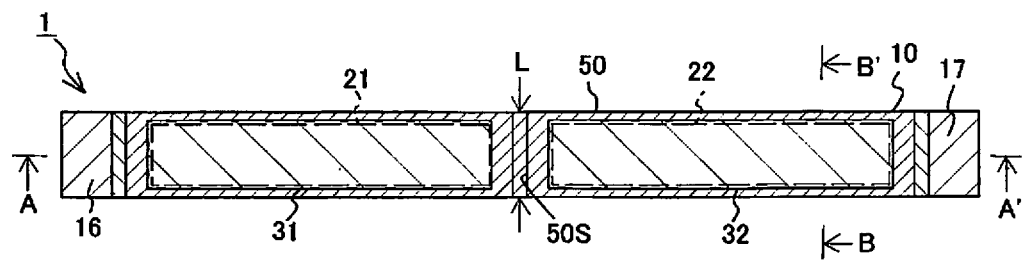
FIG. 1A is a schematic plan view of a light-emitting device according to an embodiment of the present invention.

Light-emitting devices to be described below are intended to embody the technical concept of the present invention and do not limit the present invention to the devices below. It is noted that there is a case where magnitudes or positional relations of members illustrated in the drawings are exaggerated in order to clarify the descriptions.

Figure 1B:
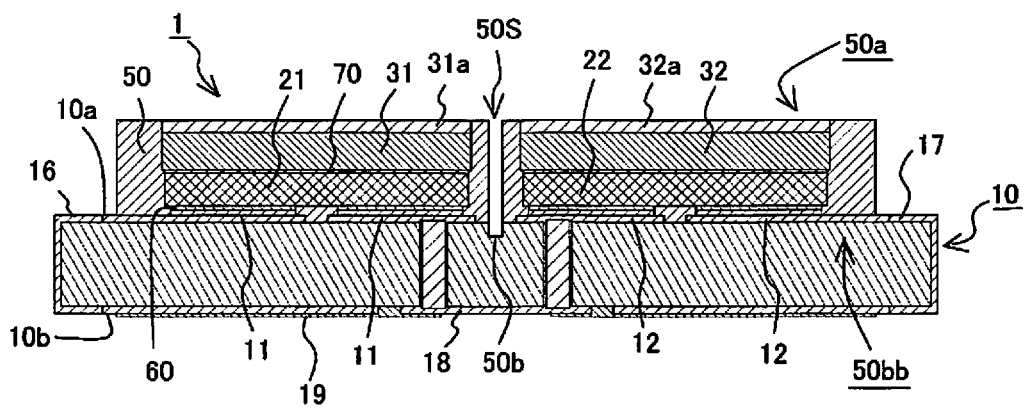
FIG. 1B is a schematic cross-sectional view taken along the line A-A' of the light-emitting device shown in FIG. 1A.
Figure 1C:
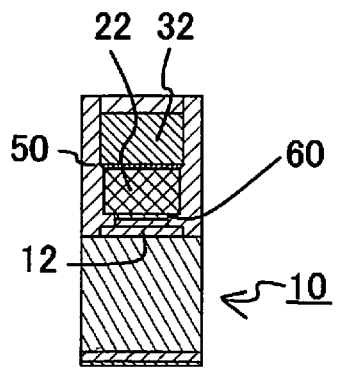
FIG. 1C is a schematic cross-sectional view taken along the line B-B' of the light-emitting device shown in FIG. 1A.

In the present application, the terms "above" and "below" or "upper" and "lower" surfaces coincide with the up-and-down direction of a light-emitting device or each component in the state shown in FIG. 1B.

A light-emitting device 1 in one embodiment includes, for example, a mounting board 10, a first light-emitting element 21, a second light-emitting element 22, and a light-reflective covering member 50 as shown in FIGS. 1A to 1E. The mounting board 10 includes first lands 11 and second lands 12 on its upper surface 10a. The first light-emitting element 21 is flip-chip mounted on the first lands 11. In other words, positive and negative electrodes on one surface of the first light-emitting element 21 are connected to the first lands 11 via electrically-conductive adhesive members 60. The second light-emitting element 22 is flip-chip mounted on the second lands 12. In other words, positive and negative electrodes on one surface of the second light-emitting element 22 are connected to the second lands 12 via electrically-conductive adhesive members 60. The covering member 50 covers the lateral surfaces of the first light-emitting element 21, the lateral surfaces of the second light-emitting element 22, and the upper surface 10a of the mounting board 10. Between the first light-emitting element 21 and the second light-emitting element 22, a depressed portion 50s extends from the covering member 50 to the mounting board 10. Hence, a bottom surface 50b of the depressed portion 50s extends inside the mounting board 10.

In the light-emitting device 1 having the above-mentioned structure, the depressed portion 50s provides a space for the covering member 50 to expand between the first light-emitting element 21 and the second light-emitting element 22. The space reduces upward deformation, which may cause cracks in or breakage of the covering member, of the covering member 50 between the first light-emitting element 21 and the second light-emitting element 22. Accordingly, occurrence of breakage of the covering member 50 and the like can be reduced. The depressed portion 50s can also be used as a guide for positioning the light-emitting device 1.

Forming the bottom surface of the depressed portion 50s inside the mounting board 10 ensures that the covering member 50 is absent under the depressed portion 50s. Accordingly, breakage of the covering member 50 and the like is suppressed. In the case where the depressed portion 50s is formed by cutting the covering member 50, cutting the covering member 50 such that the bottom surface of the depressed portion 50s extends inside the mounting board 10 easily ensures that the covering member 50 is absent on the upper surface 10a of the mounting board 10 at the depressed portion 50s.

The light-emitting device 1 may be either a side-view or top-view type light-emitting device. A side-view light-emitting device has, for example, a structure in which a lateral surface of the light-emitting device 1 faces a circuit board or the like when the light-emitting device 1 is mounted on the circuit board or the like so that a mounting direction is substantially perpendicular to the main light-outgoing direction of the light-emitting device 1. A top-view light-emitting device has, for example, a structure in which a mounting direction is substantially parallel to the main light-outgoing direction.

The planar shape of the light-emitting device can be appropriately selected, but a quadrilateral shape is preferable because such a shape enhances mass production. In particular, in the case where the light-emitting device is used as a light source for a backlight, its planar shape is preferably a rectangle having a longitudinal direction and a short direction. In the case where the light-emitting device is used for a light source for a flashlight, its planar shape is preferably a square.

Covering Member 50

The covering member 50 is disposed at least between the first light-emitting element 21 and the second light-emitting element 22 and covers the upper surface 10a of the mounting board 10. The covering member 50 is preferably a light-reflective member in view of improvement in the light extraction efficiency of the light-emitting device. The term "light-reflective" means, for example, that the reflectance of light is 70% or more at emission peak wavelengths of the first light-emitting element and the second light-emitting element.

Examples of the planar shape of the covering member 50 include polygons such as quadrilaterals, circles, and ellipses. Among these shapes, quadrilaterals are preferable, and a quadrilateral that is long in the direction along which the first lands and the second lands described later are aligned is more preferable. This structure makes the light-emitting device preferable for use as a light source for a backlight. The covering member 50 preferably extends in the direction along which the first lands and the second lands are aligned. The covering member 50 includes a first lateral surface adjacent to an upper surface 50a and a lower surface 50bb, a second lateral surface opposite to the first lateral surface, and third and fourth lateral surfaces each being adjacent to the upper surface 50a, the lower surface 50bb, and the first lateral surface. In this case, the first lateral surface is preferably long in the alignment direction of the first lands and the second lands.

Figure 3A:
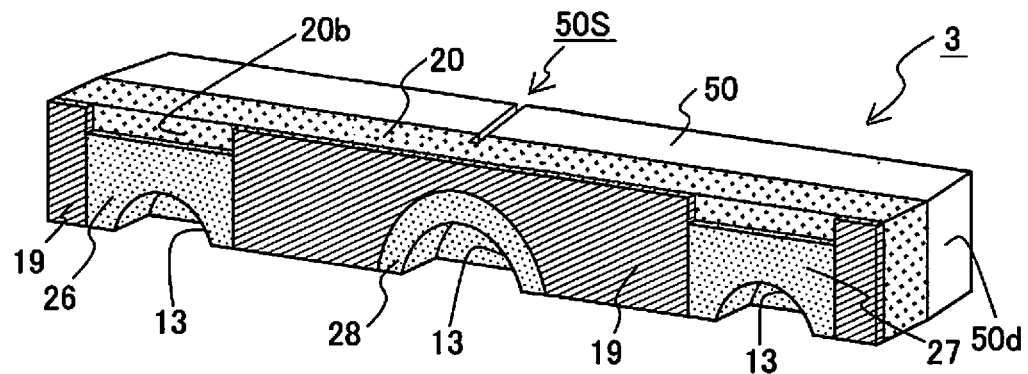
FIG. 3A is a schematic perspective view of a light-emitting device according to still another embodiment of the present invention.

Preferably, the planar shape of the covering member 50 substantially coincides with the planar shape of the light-emitting device 1 as shown in FIG. 3A. This structure enables miniaturization of the light-emitting device.

At least one of the first, second, third, and fourth lateral surfaces of the covering member 50 is preferably inclined toward the inside or outside of the light-emitting device. In particular, the at least one lateral surface is preferably inclined inward along the direction toward the upper surface. More preferably, a lateral surface of the covering member 50 oriented to a direction generally perpendicular to the first lateral surface or the second lateral surface (in other words, a lateral surface extends on a plane that intersects the alignment direction of the first lands and the second lands) is inclined inward along the direction toward the upper surface. This structure alleviates the first lateral surface, which faces a circuit board when the light-emitting device 1 is mounted on the circuit board or the like, of the covering member 50 from having contact with the surface of the circuit board, therefore the light-emitting device 1 tends to be stably mounted. Also, the structure reduces the stress generated by contact with the circuit board when the covering member 50 is expanded by heat after the mounting. Additionally, in the mounting process or the like, the second lateral surface of the covering member 50 is less likely to contact with a suction nozzle (i.e., collet), thereby reducing damage to the covering member 50 at the time of suction of the light-emitting device 1. Also, inclination of a lateral surface of the covering member 50 makes the lateral surface of the mounting board 10 on the same side as the lateral surface of the covering member 50 have contact with peripheral components first when the light-emitting device 1 is incorporated into a lighting unit or the like, thereby reducing strain of the covering member 50 caused by stress. Accordingly, generation of cracks in the covering member 50 is further reduced. The inclination is preferably 0.3° to 3°, more preferably 0.5° to 2°, further preferably 0.7° to 1.5°, relative to the normal direction of the upper surface of the mounting board 10.

The first, second, third, and fourth lateral surfaces of the covering member 50 refer to the lateral surfaces constituting the outer lateral surfaces of the light-emitting device 1. Also in the case where the covering member 50 is divided by the depressed portion 50s, the third and fourth lateral surfaces refers to the surfaces constituting the outer lateral surfaces of the light-emitting device 1, but not the surfaces constituting the depressed portion 50s.

In the case where the planar shape of the covering member 50 is a quadrilateral elongated in the direction along which the first lands and the second lands are aligned, the first lateral surface of the covering member 50 and the first lateral surface of the mounting board described later preferably constitute substantially the same surface. In the case where the lateral surface of the covering member are inclined as described above, it is preferable that no step exist at the boundary between the first lateral surfaces of the covering member 50 and the mounting board 10 and that the first lateral surfaces be substantially flush with each other. The term "substantially" here means that a step of about some tens of micrometers is acceptable. Here, only the first lateral surfaces of the covering member 50 and the mounting board 10 may be flush with each other at the boundary, but it is preferable that both of the first and second lateral surfaces of the covering member 50 be flush with the first and second lateral surfaces of the mounting board 10.

Between the first light-emitting element and the second light-emitting element, the width of the covering member 50 in the direction perpendicular to the lateral surface of the first light-emitting element or the second light-emitting element is preferably about 50 µm or more. Light from the light-emitting elements is thus sufficiently blocked. A width of the covering member 50 is preferably about 150 µm to 300 µm in order to enhance its strength.

The covering member 50 preferably includes a base material and a light-reflective substance.

Base Material of Covering Member

For the covering member 50, a base material that changes from a liquid into a solid by curing is preferably used to facilitate manufacture. With such a base material, the covering member 50 can be easily formed by transfer molding, injection molding, compression molding, potting, or the like.

A resin can be used for the base material of the covering member. Examples thereof include silicone resins, epoxy resins, phenolic resins, polycarbonate resins, acrylic resins, and modified resins of these resins. Among these resins, silicone resins and modified silicone resins have good heat and light resistance and are thus preferable. Specific examples of the silicone resins include dimethyl silicone resins, phenyl-methyl silicone resins, and diphenyl silicone resins.

In the case where the covering member 50 includes a resin as the base material, the coefficient of linear expansion of the covering member 50 is larger than the coefficients of linear expansion of materials constituting the mounting board 10, the first light-emitting element 21, and the second light-emitting element 22 described later. In the case where a plurality of materials constitute the covering member, such as the case where a light-reflective substance, a filler, and the like described later are mixed in the base material, the coefficient of linear expansion of the composite material is meant.

Light-Reflective Substance

Examples of the light-reflective substance include white pigments.

Examples of the white pigments include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide. These pigments can be used singly, or two or more of these pigments can be used in combination. The shape of the white pigments may be indefinite or crushed but is preferably spherical in view of fluidity. The particle diameter of the white pigments is, for example, about 0.1 μm to 0.5 μm, and smaller particle diameters are preferable to enhance effects of light reflection and covering. The content of the light-reflective substance in the covering member is preferably 10 to 80 wt %, more preferably 20 to 70 wt %, further preferably 30 to 60 wt % relative to the total weight of the covering member in view of light reflectivity, the viscosity in a liquid state, and the like.

The covering member may contain a filler. Examples of the filler include silicon oxide, aluminum oxide, zirconium oxide, and zinc oxide. These fillers can be used singly, or two or more of these fillers can be used in combination. Silicon oxide, which has a small coefficient of thermal expansion, is particularly preferable.

Depressed Portion 50s

The depressed portion 50s is formed in the covering member 50 between the first light-emitting element and the second light-emitting element as described above, and its bottom surface 50b is located inside the mounting board 10.

In the case where the covering member 50 has a quadrilateral shape in a plan view, the depressed portion 50s preferably extends in such a direction as to connect the first lateral surface and the second lateral surface opposite to each other. The ends of the depressed portion 50s may not reach the lateral surfaces, but the ends preferably reach at least one, preferably both, of the lateral surfaces. If the depressed portion 50s reaches the pair of lateral surfaces of the covering member, the surface area of the covering member 50 increases, which improves heat dissipation performance, thereby effectively reducing formation of cracks in the covering member 50. Also, the depressed portion 50s more preferably extends orthogonally to the first lateral surface and the second lateral surface. In particular, in the case where the covering member 50 has a rectangular shape, the depressed portion 50s preferably extends in the short direction so as to be orthogonal to the longitudinal direction. Since the amount of thermal expansion of the covering member 50 is large in the longitudinal direction of the covering member 50, forming the depressed portion 50s so as to divide the longitudinal direction of the covering member 50 reduces thermal stress on the covering member 50. Accordingly, generation of cracks in the covering member is reduced.

Also, forming the bottom surface 50b of the depressed portion 50s inside the mounting board 10 ensures heat dissipation not only from the covering member but also from the mounting board, thereby effectively reducing generation of cracks.

The depressed portion 50s is preferably formed in the middle portion of the covering member 50 between the first light-emitting element 21 and the second light-emitting element 22 in a plan view. The planar shape of the depressed portion 50s may be like either a line or aligned dots. Alternatively, any of curved lines, wavy lines, dashed lines, and polygonal lines is possible. In addition, the lateral surfaces of the depressed portion 50s are preferably perpendicular from the upper surface of the covering member 50 to the lower surface on the mounting board, but the lateral surfaces may be inclined. A tapered or reverse tapered shape is also possible. In other words, in a cross-sectional view along the longitudinal direction, the lateral surfaces of the depressed portion 50s may be either perpendicular or inclined relative to the upper surface 10a of the mounting board 10.

The number of the depressed portion 50s is not limited to one but may be two or more between the first light-emitting element 21 and the second light-emitting element 22.

Figure 1D:
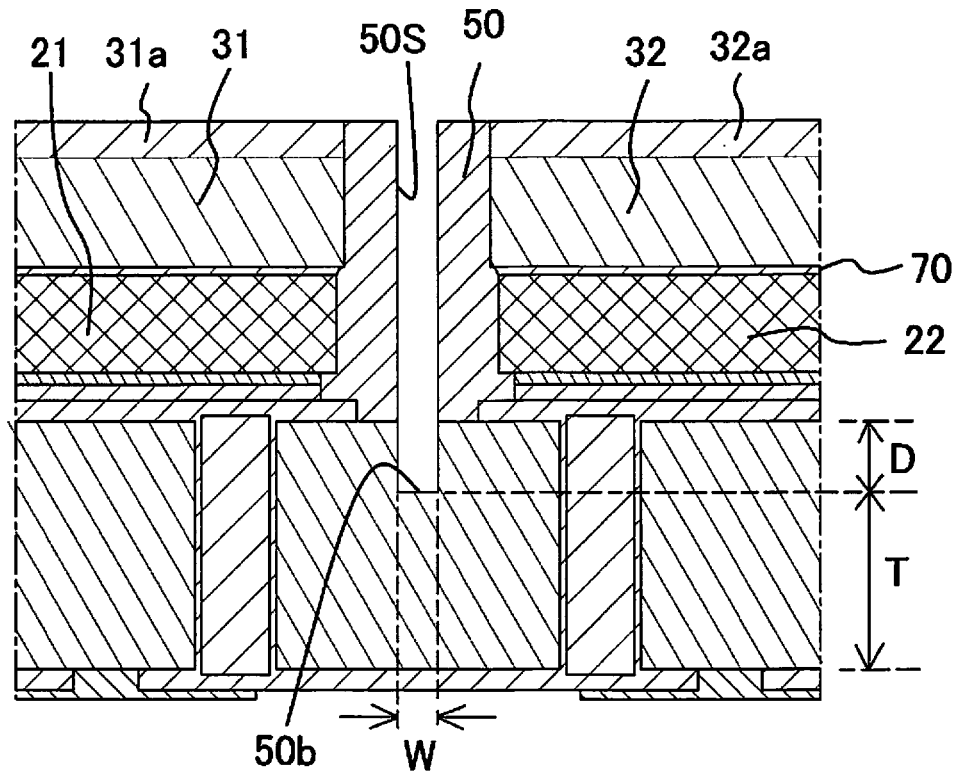
FIG. 1D is a schematic enlarged view of a part of the light-emitting device shown in FIG. 1A.
Figure 1E:
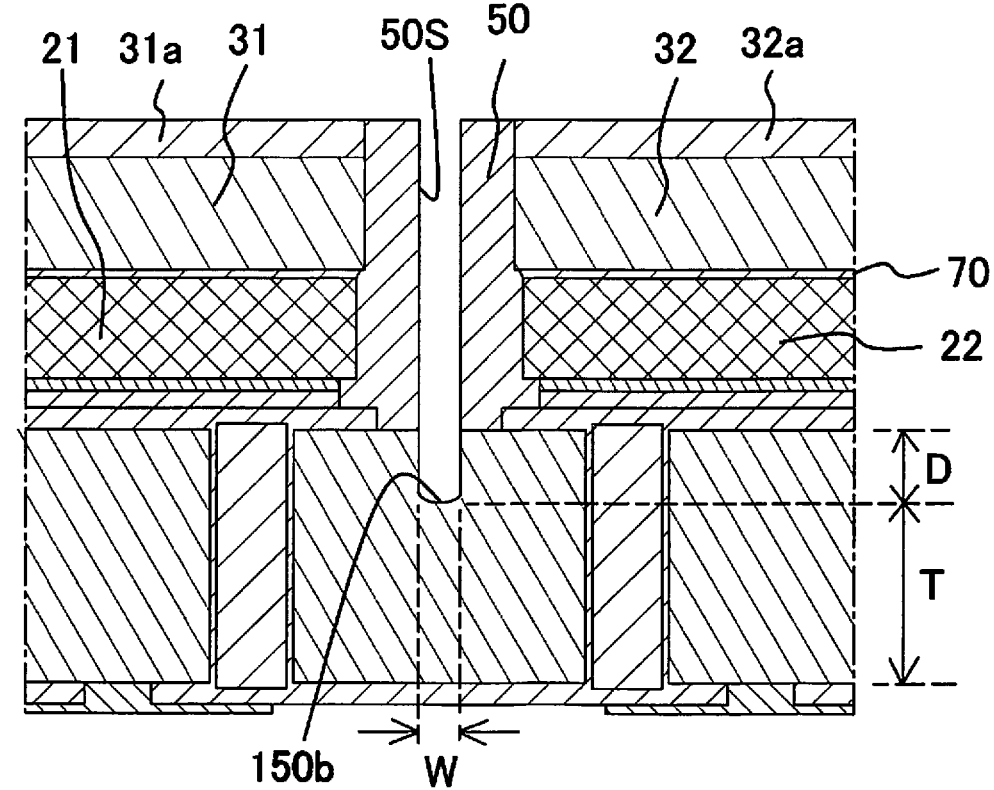
FIG. 1E is a schematic enlarged view of a part of a modification of the light-emitting device shown in FIG. 1A.

The width (W in FIG. 1E) of the depressed portion 50s in a top view can be appropriately selected depending on the amount of thermal expansion of the covering member 50 that sandwiches the depressed portion 50s. The width is preferably set such that the depressed portion 50s remains when the covering member 50 is expanded by heat applied during use, manufacturing, or assembling of the light-emitting device. For example, the lower limit of the width W of the depressed portion 50s is preferably 0.01 mm or more, more preferably 0.03 mm or more, even more preferably 0.1 mm or more. The upper limit of the width W of the depressed portion 50s can be appropriately selected but is preferably 0.4 mm or less, more preferably 0.3 mm or less, in view of ensuring the thickness of the covering member 50 between the first light-emitting element 21 and the second light-emitting element 22. The length (L in FIG. 1A) of the depressed portion 50s is preferably 0.3 mm or more, more preferably the length extends over the whole length from the upper surface to the lower surface of the covering member 50. The depth (D in FIG. 1E) of the depressed portion 50s from the upper surface 10a of the mounting board 10 to the bottom surface 50b is preferably 0.01 mm or more, more preferably 0.1 mm or more. From another point of view, the thickness (T in FIG. 1E) of the mounting board 10 remaining out of the depressed portion 50s is preferably 0.3 mm or more, more preferably 0.4 mm or more. The bottom surface 50b may be either a flat surface as shown in FIG. 1D or a bottom surface 150b including a curved surface as shown in FIG. 1E.

Forming the depressed portion 50s having such a shape effectively reduces generation of cracks in the covering member 50, particularly cracks at portions in direct contact with lateral surfaces of the first light-emitting element 21, the second light-emitting element 22, a first light-transmissive member 31, and a second light-transmissive member 32 described later.

The upper surface of the covering member 50 may be a flat surface or may be a convex or concave surface formed by, for example, creeping up due to surface tension before curing and/or by cure shrinkage. The depressed portion 50s is formed in a different manner from such a concave surface formed by cure shrinkage.

The depressed portion 50s can be formed in the covering member 50 by machining with a rotary-disk dicing saw, cutting with a draw- or push-cutter, molding with a mold or die, or the like. The depressed portion 50s extending from the covering member 50 to the mounting board 10 can be easily formed by machining or cutting.

The depressed portion 50s may be formed in the manufacturing process by forming a plurality of light-emitting elements 21 and 22 or a plurality of covering members 50 in an array and continuously and linearly cutting adjacent covering members 50, which respectively constitute portions of other light-emitting devices. This procedure is preferable because the depressed portion 50s is easily formed.

As described later, in the case where three or more light-emitting elements are mounted in one light-emitting device, it is preferable that depressed portions 50s are respectively formed between two adjacent light-emitting elements.

Mounting Board 10

The mounting board 10 includes a pair of first lands 11 and a pair of second lands 12 on its upper surface 10a, and is a member on which the light-emitting elements are to be mounted. Wirings that couple the lands or are drawn between the lands may be disposed on the upper surface 10a, inside, and on the lower surface 10b opposite to the upper surface of the mounting board 10.

The mounting board 10 can be made of, for example, a resin, a fiber-reinforced resin, a ceramic, glass, a metal, or paper. Examples of the resin or fiber-reinforced resin include epoxy resins, glass epoxy resins, bismaleimide-triazine (BT) resins, and polyimides. Examples of the ceramic include aluminum oxide, aluminum nitride, zirconium oxide, zirconium nitride, titanium oxide, titanium nitride, and mixtures of these. Examples of the metal include copper, iron, nickel, chromium, aluminum, silver, gold, titanium, and alloys of these. Among these materials, insulating materials are preferable. A filler and the like may be mixed in the ceramic, resin, glass, or the like.

Preferably, the mounting board is particularly formed of a material having physical properties similar to the coefficients of linear expansion of the first light-emitting element and the second light-emitting element. Accordingly, the mounting board is less likely to separate from the first light-emitting element and the second light-emitting element, and the first light-emitting element and the second light-emitting element are less likely to be broken due to differences in coefficients of thermal expansion from the mounting board. The smaller the coefficient of linear expansion of the mounting board is, the less the first light-emitting element 21 and the second light-emitting element 22 mounted on the mounting board 10 likely to move, and thus the thermal stress on the covering member 50 at the position between the elements tends to be larger. Hence, it is technically meaningful to reduce thermal stress accumulated in the covering member 50 by forming the depressed portion 50s in the present embodiment. Accordingly, the coefficient of linear expansion of the mounting board is preferably 15 ppm/° C. or less, more preferably 10 ppm/° C. or less, further preferably 5 ppm/° C. or less, and preferably 1 ppm/° C. or more. In the case where the mounting board contains a filler or the like in addition to the above-mentioned ceramic, resin, or glass, the coefficient of linear expansion of the mounting board means the coefficient of linear expansion of the mounting board as being the composite material thereof.

Examples of the planar shape of the mounting board 10 include polygons such as quadrilaterals, circles, and ellipses. Among these shapes, quadrilaterals are preferable, and a quadrilateral elongated in the direction along which the first lands and the second lands are aligned is more preferable. Also, the mounting board 10 preferably includes: the upper surface 10a and the lower surface 10b opposite to the upper surface 10a; the first lateral surface that extends along the alignment direction of the first lands and the second lands, and that is adjacent to the upper surface 10a and the lower surface 10b; the second lateral surface opposite to the first lateral surface; and third and fourth lateral surfaces each being adjacent to the upper surface 10a, the lower surface 10b, and the first lateral surface. The first lateral surface is preferably elongated in the alignment direction of the first lands and the second lands.

The thickness of the mounting board is preferably 0.05 mm or more, more preferably 0.2 mm or more, in view of the strength of the mounting board. The thickness of 0.5 mm or less is preferable, and the thickness of 0.4 mm or less is more preferable.

Part of the depressed portion 50s is formed on the upper surface 10a of the mounting board 10 as described above. The lower surface 10b may be substantially flat, or at least one hollow 13 may be formed as shown in FIG. 3C. The depth of the hollow 13 can be small enough to ensure the strength of the mounting board, and examples of the depth include about 5% to about 50% of the thickness of the mounting board. The position of the hollow 13 may overlap or may not overlap the depressed portion 50s in a transparent view from the upper surface of the mounting board. In the case where two or more hollows 13 are formed, all or part of the hollows 13 may overlap the depressed portion 50s in a transparent view from the upper surface of the mounting board. The lower surface of the mounting board preferably has one of the hollows 13 at a position opposite to the depressed portion 50s as shown in FIG. 3C. The combination of the hollow and the depressed portion 50s can constitute a preferable stress-dispersing structure of the covering member 50, and facilitates further reduction of crack generation in main portions of the covering member 50.

Figure 3B:
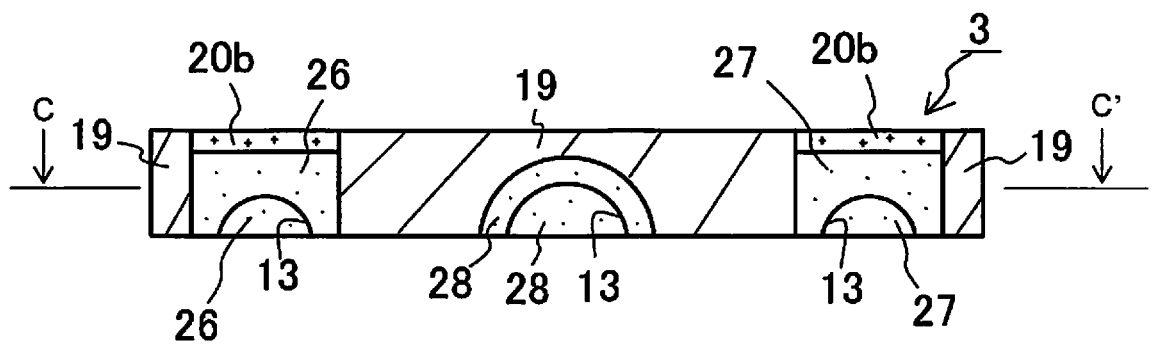
FIG. 3B is a schematic bottom view of the light-emitting device shown in FIG. 3A.
Figure 3C:
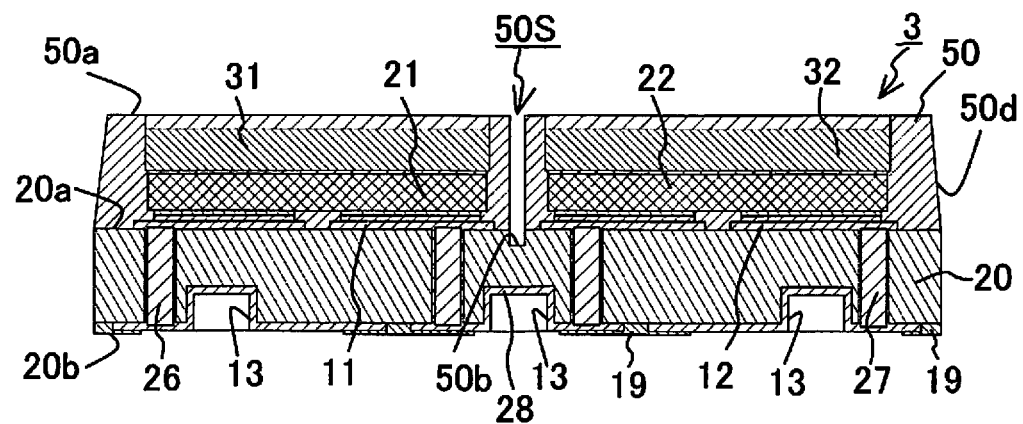
FIG. 3C is a schematic cross-sectional view taken along the line C-C' of the light-emitting device shown in FIG. 3B.

In a plan view from the lower surface of the mounting board, the hollows 13 may be each formed in contact with both of the first and second lateral surfaces, in contact with one side (for example, only the first lateral surface) as shown in FIGS. 3A to 3C, or inside and away from the sides of the mounting board. Among the above-mentioned cases, it is preferable that the hollows 13 be in contact only with the first lateral surface (see FIG. 3C). The shapes of hollows 13 on the lower surface of the mounting board may be any of polygons such as quadrilaterals, circles, ellipses, semicircles, and the like. The hollows 13 may have a thickness extending either in the direction orthogonal to the lower surface or in a direction inclined relative to the lower surface. The degree of inclination is, for example, ±10° relative to the lower surface.

Part of the wirings is preferably disposed on the inner surfaces of the hollows 13. With this structure, a light-emitting device 3 can be firmly mounted by performing mounting such that a bonding material such as solder is retained inside the hollows 13.

First Lands 11 and Second Lands 12

The first lands 11 and the second lands 12 are both formed with electrically-conductive materials, and can each have a single-layer structure or a layered structure made of known electrode materials. Examples of the materials include copper, iron, nickel, tungsten, chromium, aluminum, silver, gold, titanium, palladium, rhodium, and their alloys. Among these materials, copper or copper alloys are preferable in view of heat dissipation performance. On the surfaces of the first and second lands, layers of materials such as silver, platinum, aluminum, rhodium, gold, and their alloys may be disposed in view of ensuring wettability by the electrically-conductive adhesive members or the like and/or ensuring light-reflecting properties. The material and/or structure may not be the same in both of the first lands 11 and the second lands 12 but is preferably the same. Examples of the electrically-conductive adhesive members include bumps of gold, silver, or copper; metal pastes each containing a resin binder with powder of a metal such as silver, gold, copper, platinum, aluminum, and palladium; tin-bismuth, tin-copper, tin-silver, and gold-tin solders; and brazing filler metals such as low-melting-point metals.

Similarly to the first lands and the second lands, the wirings are formed of electrically-conductive materials. The wirings may be formed of the same material as for the first and second lands. For example, the first lands 11 and the second lands 12 can each be formed of a layered material such as Cu/Ni/Au from the mounting board. The thicknesses of the first lands 11 and the second lands 12 are large enough to provide appropriate electric resistance. The thicknesses of the wirings may be the same as, smaller than, or larger than the thicknesses of the first and second lands.

The first lands and the second lands are preferably aligned in a row on the upper surface of the mounting board 10. The pair of first lands and second lands may be aligned in a direction different from the alignment direction of the row depending on the electrode configurations of the light-emitting elements to be used, but are preferably aligned in the same alignment direction as the row. Such an alignment provides the suitable light distribution according to the intended use of the light-emitting device while enabling miniaturization and slimming down of the light-emitting device.

The shapes of the first lands and the second lands can be adjusted depending on the electrode configurations of the light-emitting elements to be used, and examples of the planar shapes include polygons such as quadrilaterals, circles, and ellipses. Among these shapes, quadrilaterals are preferable. The distance between the first lands and the second lands can be adjusted depending on the electrode configurations and the sizes of the light-emitting elements to be used, the thickness of the covering member 50, and the like.

First Light-Emitting Element 21 and Second Light-Emitting Element 22

The first light-emitting element 21 and the second light-emitting element 22 each include at least a semiconductor element structure. The semiconductor element structure includes a layered body of semiconductor layers, that is, at least an n-type semiconductor layer and a p-type semiconductor layer. An active layer is preferably disposed between the semiconductor layers. Examples of semiconductor materials include nitride semiconductors, InAlGaAs semiconductors, InAlGaP semiconductors, zinc sulfide, zinc selenide, and silicon carbide. Among these materials, a nitride semiconductor, which can emit short-wavelength light that can efficiently excite wavelength conversion substances, is preferably used. A nitride semiconductor is typically represented by the general formula $In_xAl_yGa_{1-x-y}N$ (0≤x, 0≤y, x+y≤1).

The emission peak wavelengths of the first light-emitting element and the second light-emitting element can be selected from the ultraviolet range to the infrared range by changing the semiconductor materials or their mixing ratio. The emission peak wavelengths of the first light-emitting element and the second light-emitting element are preferably 400 nm to 530 nm, more preferably 420 nm to 490 nm, further preferably 450 nm to 475 nm, in view of light-emission efficiency, excitation of a wavelength conversion substance and color mixing relations between its excitation and light emission, and the like.

The semiconductor element structure may include, in addition to the semiconductor layered body, a crystal growth substrate on which a semiconductor crystal constituting the semiconductor element structure can be grown. Alternatively, the semiconductor element structure may include a bonding substrate that is bonded to the semiconductor element structure separated from a crystal growth substrate. Examples of a substrate include sapphire, spinel, gallium nitride, aluminum nitride, silicon, silicon carbide, gallium arsenide, gallium phosphide, indium phosphide, zinc sulfide, zinc oxide, zinc selenide, and diamond. Sapphire is preferable among them. A substrate having light transmissivity facilitates employment of flip-chip mounting and enhancement of light extraction efficiency. The thickness of the substrate is, for example, 0.02 mm to 1 mm.

The semiconductor element structure may include positive and negative electrodes and/or an insulating film. The positive and negative electrodes can include gold, silver, tin, platinum, rhodium, titanium, aluminum, tungsten, palladium, nickel, or their alloy. The insulating film can include an oxide or nitride of at least one element selected from the group consisting of silicon, titanium, zirconium, niobium, tantalum, and aluminum.

Examples of the first light-emitting element and the second light-emitting element include LED chips.

The planar shape of each of the light-emitting elements is preferably a rectangle, particularly a square or a rectangle elongated in one direction, but a hexagon or the like is also possible. The lateral surfaces of the first and second light-emitting elements or their mounting boards may be each perpendicular to the upper surface and/or the lower surface or may be inclined inward or outward. The first light-emitting element and the second light-emitting element each preferably have positive and negative (p- and n-) electrodes on the same surface.

Three or more light-emitting elements may be mounted in one light-emitting device. In this case, the emission wavelengths of the light-emitting elements may be either the same or different.

Light-Transmissive Member

The light-emitting device preferably includes a light-transmissive member on the light-emitting element. The light-transmissive member transmits light emitted from the light-emitting elements to the outside of the device. One light-transmissive member may be disposed for a plurality of light-emitting elements, but it is preferable that a plurality of the light-transmissive members be respectively disposed for a plurality of the light-emitting elements. For example, the light-emitting device preferably includes the first light-transmissive member 31 and the second light-transmissive member 32 respectively bonded to the upper surfaces of the first light-emitting element 21 and the second light-emitting element 22.

The light-transmissive members each preferably has a light transmittance of 60% or more, preferably 80% or more or 90% or more, at the emission peak wavelengths of the light-emitting elements.

The light-transmissive member can be formed with, for example, a light-transmissive base material. The light-transmissive member preferably contains a wavelength conversion substance and/or a filler, and the wavelength conversion substance absorbs light from the light-emitting elements to emit light. A sintered body of a wavelength conversion substance and an inorganic material such as alumina, a plate-shaped crystal of the wavelength conversion substance, or the like may be used for the light-transmissive member.

The light-transmissive member may have a layered structure that includes: two or more of a layer containing only a light-transmissive base material; a layer containing the light-transmissive base material and a wavelength conversion substance and/or filler; a layer containing the light-transmissive base material and another wavelength conversion substance and/or filler, and other layers.

The difference in coefficients of thermal expansion between the covering member 50 and the light-transmissive members 31 and 32 is preferably smaller than the difference in coefficients of thermal expansion between the covering member 50 and the light-emitting elements 21 and 22. This structure reduces thermal stress accumulation in the covering member 50 at the portions adjacent to the lateral surfaces of the light-transmissive members 31 and 32, thereby enabling reduction in crack generation in the covering member 50. For example, in the case where the base material of the covering member 50 is a resin, it is preferable that the base material of the light-transmissive members 31 and 32 be also a resin.

On the other hand, in the case where the base material of the light-transmissive members is sintered bodies of an inorganic material such as glass and alumina in order to provide a reliable light-emitting device, the difference in coefficients of thermal expansion between the covering member 50 and the light-transmissive members is comparatively large. In this case, forming the depressed portion 50s in the covering member near the lateral surfaces of the light-transmissive members reduces thermal stress accumulation in the covering member 50, thereby enabling reduction in crack generation in the covering member 50.

Base Material of Light-Transmissive Member

Examples of the base material of the light-transmissive members include silicone resins, epoxy resins, phenolic resins, polycarbonate resins, acrylic resins, modified resins of these resins, and glass. Among these resins, silicone resins and modified silicone resins are preferable due to its good heat and light resistance. Specific examples of the silicone resins include dimethyl silicone resins, phenyl-methyl silicone resins, and diphenyl silicone resins. The first light-transmissive member and the second light-transmissive member can each include one of these base materials, or include two or more of these base materials layered on each other.

Filler

Examples of the filler include silicon oxide, aluminum oxide, zirconium oxide, and zinc oxide. These materials can be used singly, or two or more of these materials can be used in combination as the filler. Among these materials, silicon oxide, which has a small coefficient of thermal expansion, is preferable. Using nanoparticles as the filler can increase scattering such as Rayleigh scattering of blue light from the first light-emitting element and the second light-emitting element, and thus can reduce the amount of the wavelength conversion substance used. The nanoparticles are particles whose diameters are within a range of from 1 nm to 100 nm. The "particle diameter" can be defined as, for example, $D_{50}$.

Wavelength Conversion Substance

The wavelength conversion substance absorbs at least part of primary light emitted from the first and second light-emitting elements, and emits secondary light that differs in wavelengths from the primary light. This constitution can provide a light-emitting device that emits mixed light, such as white light, of the primary light and the secondary light having visible wavelengths.

Examples of green light emitting phosphors used for the wavelength conversion substance include yttrium-aluminum-garnet based phosphors (for example, $Y_3(Al,Ga)_5O_{12}$:Ce), lutetium-aluminum-garnet based phosphors (for example, $Lu_3(Al,Ga)_5O_{12}$:Ce), terbium-aluminum-garnet based phosphors (for example, $Tb_3(Al,Ga)_5O_{12}$:Ce), silicate based phosphors (for example, $(Ba,Sr)_2SiO_4$:Eu), chlorosilicate based phosphors (for example, $Ca_8Mg(SiO_4)_4Cl_2$:Eu), β-SiAlON based phosphors (for example, $Si_{6-z}Al_zO_zN_{8-z}$:Eu (0<z<4.2)), and SGS based phosphors (for example, $SrGa_2S_4$:Eu). Examples of yellow-emitting phosphors include α-SiAlON based phosphors (for example, $M_z(Si,Al)_{12}(O,N)_{16}$ (where 0<z≤2, M is Li, Mg, Ca, Y, or a lanthanoid element except for La and Ce)).

Some of the above-mentioned green light emitting phosphors emit yellow light. Yellow light can be obtained by substituting part of Y in an yttrium-aluminum-garnet based phosphor with Gd to shift its emission peak wavelength to a longer wavelength. Some of such phosphors can emit orange light. Examples of red-emitting phosphors include nitrogen-containing calcium aluminosilicate (CASN or SCASN) based phosphors (for example, $(Sr,Ca)AlSiN_3$:Eu) and manganese-activated fluoride based phosphors (phosphors represented by the general formula (I) $A_2[M_{1-a}Mn_aF_6]$ (in the general formula (I), The symbol "A" is at least one selected from the group consisting of K, Li, Na, Rb, Cs, and $NH_4$, M is at least one element selected from the group consisting of the Group IV elements and the Group XIV elements, and the symbol "a" satisfies 0<a<0.2)). Examples of the manganese-activated fluoride based phosphors include manganese-activated potassium fluorosilicate phosphors (for example, $K_2SiF_6$:Mn). Among these phosphors, the wavelength conversion substance preferably contains a manganese-activated fluoride based phosphor. Manganese-activated fluoride phosphors are preferable in view of color reproducibility because emission of light having a comparatively narrow spectral bandwidth can be obtained, but manganese-activated fluoride phosphors have a property of being easily deteriorated by moisture. Hence, it is technically meaningful to reduce thermal stress accumulation in the covering member 50 by forming the depressed portion 50s as in the present embodiment to reduce generation of cracks in the covering member 50 in order to alleviate intruding of water through the cracks. One wavelength conversion substance may be used, or two or more wavelength conversion substances may be used in combination.

Each of the light-transmissive members may include a phosphor-containing portion and a portion containing substantially no phosphor. In the case where the light-transmissive member including a portion containing substantially no phosphor above the phosphor-containing portion, the phosphor can be protected from external environments, such as water.

Due to the property of the manganese-activated fluoride phosphor being readily deteriorated by moisture, a phosphor-containing portion containing a manganese-activated fluoride phosphor in the light-transmissive member is preferably positioned nearer to the light-emitting element than a portion of the light-transmissive member forming the upper surface of the light-emitting device is. Since cracks in the covering member 50 tends to be generated by the difference in coefficients of thermal expansion between the light-emitting element and the covering member, the cracks are likely to be generated near the light-emitting element. Hence, in the case where the light-transmissive member has the above-mentioned structure, it is technically meaningful to reduce thermal stress accumulation in the covering member 50 by forming the depressed portion 50s as in the present embodiment to reduce generation of cracks in the covering member 50 in order to reduce the probability of moisture intrusion through the cracks.

In the case where a plurality of light-emitting elements are disposed, the light-transmissive members may contain either the same wavelength conversion substance to each other or different wavelength conversion substances to the other. For example, a first light-transmissive member that can absorb light from the first light-emitting element to output white light as the mixture with the light from the first light-emitting element may be disposed on the first light-emitting element, and a second light-transmissive member that can absorb light from the second light-emitting element to output orange light as the mixture with the light from the second light-emitting element may be disposed on the second light-emitting element.

The light-transmissive members are bonded to the upper surfaces of the light-emitting elements with bonding members. The bonding members are formed with, for example, a light-transmissive adhesive that can ensure adhesion between the light-emitting elements and the light-transmissive members. Examples of the bonding members include silicone resins, epoxy resins, phenolic resins, polycarbonate resins, acrylic resins, and modified resins of these resins. Among these resins, silicone resins and modified silicone resins are preferable due to its good heat and light resistance. Examples of the silicone resins include dimethyl silicone resins, phenyl-methyl silicone resins, and diphenyl silicone resins. Similarly to the light-transmissive members, the bonding members may also contain a filler.

In the case where the light-transmissive members are bonded to the upper surfaces of the light-emitting elements, the lateral surfaces of the light-transmissive members are preferably covered with the covering member. In this case, only part of the lateral surfaces of the light-transmissive members may be covered, but it is preferable that the entire lateral surfaces be covered. Upper surfaces 31a and 32a of the light-transmissive members is flush with the upper surface 50a of the covering member preferably.

In the case where the first light-transmissive member 31 and the second light-transmissive member 32, which contain wavelength conversion substances being as heat sources, are respectively bonded to the upper surfaces of the first light-emitting element 21 and the second light-emitting element 22, thermal stress on the covering member 50 on the mounting board easily increases. Hence, it is technically meaningful to reduce thermal stress accumulation in the covering member 50 by forming the depressed portion 50s as in the present embodiment. Particularly in the case where a manganese-activated fluoride phosphor, which generates more heat than other phosphors applicable for light-emitting devices do, is used, it is technically meaningful to reduce thermal stress accumulation in the covering member 50 by forming the depressed portion 50s as in the present embodiment.

In the case where the light-transmissive members are bonded to the upper surfaces of the light-emitting elements, the bonding members for bonding the light-transmissive members may cover part of the lateral surfaces of the light-emitting elements. In this case, the covering member preferably covers the entire lateral surfaces of the light-emitting elements with the bonding members therebetween.

First Embodiment

As shown in FIGS. 1A to 1D, the light-emitting device 1 is a side-view LED having a width of 3.1 mm, a height of 0.4 mm, and a depth of 0.7 mm.

The mounting board 10 is a rectangular-cuboid piece formed with a BT resin (for example, HL832NSF type LCA manufactured by Mitsubishi Gas Chemical Company, Inc.) having a coefficient of linear expansion of about 3 ppm/° C. and having a width of 3.1 mm, a height of 0.4 mm, and a depth/thickness of 0.36 mm. The first lands 11 and the second lands 12 each having a layered structure of copper/nickel/gold stacked from the upper surface 10a of the mounting board 10 are disposed on the upper surface 10a of the mounting board 10. A pair of positive and negative terminals constitute the first lands 11. Another pair of positive and negative terminals constitute the second lands 12. The positive terminal of the first lands 11 is connected to the negative terminal of the second lands 12 by a wiring 13. The mounting board 10 has two vias, and the wiring 13 formed on the upper surface is electrically connected to a wiring 18 formed on the lower surface 10b by the vias. The lower surface of the mounting board 10 further includes a wiring 16 electrically connected to the negative terminal of the first lands, and a wiring 17 electrically connected to the positive terminal of the second lands along lateral surfaces of the mounting board. Part of each of the wirings 16, 17, and 18 on the lower surface 10b is covered with insulating films 19 that are solder masks.

The first light-emitting element 21 and the second light-emitting element 22 are respectively flip-chip mounted on the first lands 11 and the second lands 12 with the electrically-conductive adhesive members 60 therebetween. Each of the first light-emitting element 21 and the second light-emitting element 22 is a rectangular-cuboid LED chip that includes an n-type layer, an active layer, and a p-type layer as nitride semiconductors layered in order on a sapphire substrate. The first light-emitting element 21 and the second light-emitting element 22 can each emit blue light having an emission peak wavelength of 452 nm, and each have a width of 1.1 mm, a height of 0.2 mm, and a depth/thickness of 0.12 mm. The electrically-conductive adhesive members 60 are formed with gold-tin solder (Au:Sn=79:21) and have a thickness of 0.015 mm.

The first light-transmissive member 31 and the second light-transmissive member 32 are respectively bonded to the upper surfaces of the first light-emitting element 21 and the second light-emitting element 22 with bonding members 70. The first light-transmissive member 31 and the second light-transmissive member 32 each contain europium-activated β-SiAlON (i.e., first phosphor) and manganese-activated potassium fluorosilicate (i.e., second phosphor), as the wavelength conversion substance, and the respective wavelength conversion substances are mixed in a phenyl-methyl silicone resin base material containing silicon oxide nanoparticles as the filler. Each of the first light-transmissive member 31 and the second light-transmissive member 32 is a rectangular-cuboid piece having a width of 1.21 mm, a height of 0.24 mm, and a thickness of 0.16 mm. The first light-transmissive member 31 and the second light-transmissive member 32 each include a layer made of the base material and the first phosphor, a layer made of the base material and the second phosphor, and a layer made of the base material layered in that order layered from the first light-emitting element 21 or the second light-emitting element 22. Each of the bonding members 70 is a cured component of a dimethyl silicone resin having a depth/thickness of 0.005 mm.

The light-reflective covering member 50 is formed on the upper surface of the mounting board 10 to surround the entire lateral peripheries of the first lands 11, the second lands 12, the first light-emitting element 21, the second light-emitting element 22, the first light-transmissive member 31, and the second light-transmissive member 32. The covering member 50 contains 60 wt % of titanium oxide as a white pigment mixed in a phenyl-methyl silicone resin. The upper surface 50a of the covering member 50, the upper surface of the first light-transmissive member 31 is substantially flush with the upper surface of the second light-transmissive member 32. The maximum outside dimensions of the covering member 50 coincides with the outside dimensions of the upper surface 10a of the mounting board 10. In other words, a lateral surface extending along the longitudinal direction of the covering member 50 is flush with a lateral surface extending along the longitudinal direction of the mounting board 10.

At a generally middle position between the first light-emitting element 21 and the second light-emitting element 22, the covering member 50 has the depressed portion 50s orthogonal to the lateral surfaces extending along the longitudinal direction. The depressed portion 50s has a width (i.e., W in FIG. 1E) of 0.05 mm and a length (i.e., L in FIG. 1A) of 0.4 mm in a plan view. The depth (i.e., D in FIG. 1E) of the depressed portion 50s from the upper surface 10a of the mounting board 10 to the bottom surface 50b is about 0.08 mm. The thickness (i.e., T in FIG. 1E) of the mounting board 10 remaining out of the depressed portion 50s is about 0.28 mm or more. The thickness of the covering member 50 from a lateral surface of the depressed portion 50s to the first light-emitting element 21 or the second light-emitting element 22 is 0.3 mm. In the present embodiment, the coefficient of thermal expansion of the covering member 50 is about 110 ppm/° C., and the coefficients of thermal expansion of the first light-emitting element 21 and the second light-emitting element 22 are about 6 to 7 ppm/° C.

The amount of thermal expansion of the covering member 50 in the present embodiment is large in the longitudinal direction of the covering member 50. However, in the light-emitting device 1, forming the depressed portion 50s so as to divide the covering member 50 in the longitudinal direction provides a space for the covering member 50 to expand between the first light-emitting element 21 and the second light-emitting element 22, and the space reduces thermal stress on the covering member 50 and reduces thermal stress accumulation in the covering member 50. Accordingly, generation of cracks in the covering member can be reduced.

Also, forming the bottom surface 50b of the depressed portion 50s inside the mounting board 10 ensures heat dissipation not only from the covering member but from the mounting board, thereby further enabling reduction in crack generation.

The depressed portion 50s can also be used as a guide for positioning the light-emitting device 1.

Second Embodiment

Figure 2:
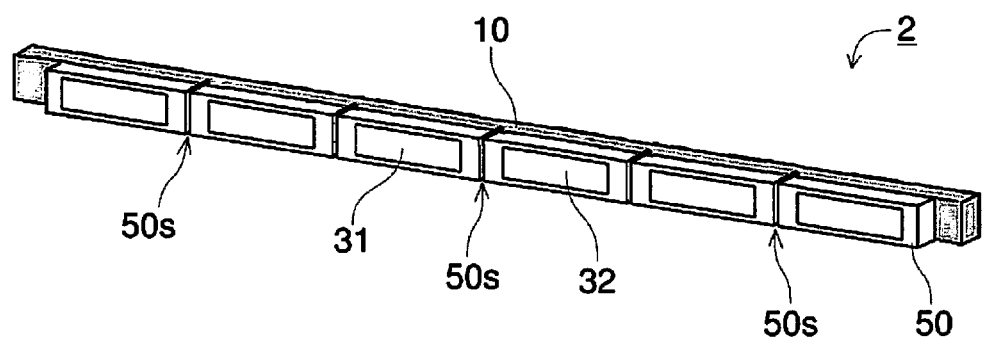
FIG. 2 is a schematic perspective view of a light-emitting device according to another embodiment of the present invention.

A light-emitting device 2 has substantially the same structure as the light-emitting device 1 except that six light-emitting elements are aligned in the longitudinal direction, and five depressed portions 50s are respectively formed between adjacent ones of the light-emitting elements as shown in FIG. 2.

The light-emitting device 2 provides effects similar to the effects of the light-emitting device 1.

Third Embodiment

In the light-emitting device 3, the covering member 50 entirely covers an upper surface 20a of a mounting board 20 as shown in FIGS. 3A, 3B, and 3C. The edges of the first lands 11 and the second lands 12 are not exposed to the outside of the light-emitting device but are covered with the covering member 50. Wirings 26 and 27 connected to the first lands 11 and the second lands 12 are formed inside vias penetrating through the mounting board 20. A lower surface 20b of the mounting board 20 has a first hollow 13 at a position opposite to the depressed portion 50s is formed, and two second hollows 13 at positions where the depressed portion 50s does not exist. The first hollow 13 and the second hollows 13 are formed at positions deviating to one of the sides extending in the longitudinal direction of the mounting board 20. A wiring 28 extends also on the inner surfaces of the hollows. The first hollow 13 and the second hollows 13 have generally semicircular-columnar shapes. Each of the wirings disposed on the lower surface of the mounting board 20 is partially covered with the insulating films 19 that are solder masks.

A lateral surface 50d of the covering member 50 oriented to a direction perpendicular to the alignment direction of the first lands 11 and the second lands 12 in a top view is inclined toward the inside of the light-emitting device relative to the lateral surface of the mounting board 20 oriented to the same direction.

The other part of the structure is substantially the same as the structure of the light-emitting device 1 except for the above-mentioned points.

The light-emitting device 3 provides effects similar to the effects of the light-emitting device 1. Covering the edges of the first lands 11 and the second lands with the covering member 50 reduces the probability of separation of the covering member 50 starting from the edges of the first lands 11 and the second lands 12, thereby providing the highly reliable light-emitting device 3. Also, forming the first hollow 13 on the lower surface 20b of the mounting board 20 at a position corresponding to the depressed portion 50s can suitably disperses stress on the covering member 50. Accordingly, crack generation in main portions of the covering member 50 can be further reduced.

A light-emitting device according to an embodiment of the present invention can be used for backlight devices of liquid-crystal displays, various lighting apparatuses, large sized displays, various displays for advertisements or destination guide, and projectors, as well as for image reading apparatuses such as digital video cameras, facsimile machines, copying machines, and scanners.

What is claimed is:

1. A light-emitting device comprising:
   a mounting board including first lands and second lands on an upper surface of the mounting board, one of the first lands being spaced apart from one of the second lands adjacent to the one of the first lands on the upper surface of the mounting board;
   a first light-emitting element flip-chip mounted on the first lands;
   a second light-emitting element flip-chip mounted on the second lands; and
   a light-reflective covering member covering a lateral surface of the first light-emitting element, a lateral surface of the second light-emitting element, and the upper surface of the mounting board, wherein
   the mounting board and the light-reflective covering member define a depressed portion between the first light-emitting element and the second light-emitting element with a bottom surface of the depressed portion being located inside the mounting board, and
   in a top view, an outer edge of a part of the depressed portion defined by the mounting board coincides an outer edge of a part of the depressed portion defined by the light-reflective covering member.

2. The light-emitting device according to claim 1, wherein a linear expansion coefficient of a material for the light-reflective covering member is larger than a linear expansion coefficient of a material for the mounting board.

3. The light-emitting device according to claim 1, wherein the light-reflective covering member includes
   an upper surface,
   a lower surface opposite to the upper surface,
   a first lateral surface adjacent to the upper surface and the lower surface, and elongated along an alignment direction of the first lands and the second lands,
   a second lateral surface opposite to the first lateral surface,
   a third lateral surface adjacent to the upper surface, the lower surface and the first lateral surface, and
   a fourth lateral surface opposite to the third lateral surface and adjacent to the upper surface, the lower surface and the first lateral surface,
the mounting board includes
   the upper surface,
   a lower surface opposite to the upper surface,
   a first lateral surface adjacent to the upper surface and the lower surface, and elongated along the alignment direction of the first lands and the second lands,
   a second lateral surface opposite to the first lateral surface,
   a third lateral surface adjacent to the upper surface, the lower surface and the first lateral surface, and
   a fourth lateral surface opposite to the third lateral surface, and adjacent to the upper surface, the lower surface and the first lateral surface.

4. The light-emitting device according to claim 3, wherein the first lateral surface of the light-reflective covering member is substantially flush with the first lateral surface of the mounting board.

5. A light-emitting device comprising:
   a mounting board including first lands and second lands on an upper surface of the mounting board, one of the first lands being spaced apart from one of the second lands adjacent to the one of the first lands on the upper surface of the mounting board;
   a first lighting-emitting element flip-chip mounted on the first lands;
   a second lighting-emitting element flip-chip mounted on the second lands; and
   a light-reflective covering member covering a lateral surface of the first light-emitting element, a lateral surface of the second light-emitting element, and the upper surface of the mounting board, wherein
   the mounting board and the light-reflective covering member define a depressed portion between the first light-emitting element and the second light emitting element with a bottom surface of the depressed portion being located inside the mounting board,
   the depressed portion reaches both a first lateral surface and a second lateral surface of the of the mounting board that are opposite to each other in a top view.

6. The light-emitting device according to claim 3, wherein the depressed portion is arranged at a generally middle position in a longitudinal direction of the light-reflective covering member, and the depressed portion extends to intersect with the longitudinal direction.

7. The light-emitting device according to claim 1, further comprising:
   a first light-transmissive member that is bonded to an upper surface of the first light-emitting element, and that contains a wavelength conversion substance configured to absorb light from the first light-emitting element to emit light; and
   a second light-transmissive member that is bonded to an upper surface of the second light-emitting element, and that contains a wavelength conversion substance configured to absorb light from the second light-emitting element to emit light,
   wherein the light-reflective covering member covers a lateral surface of the first light-transmissive member and a lateral surface of the second light-transmissive member.

8. The light-emitting device according to claim 1, wherein the mounting board includes a wiring disposed on a lower surface opposite to the upper surface, and
   the first lands and the second lands are connected to the wiring.

9. The light-emitting device according to claim 3, wherein the first lateral surface of the light-reflective covering member is substantially flush with the first lateral surface of the mounting board, and
   the second lateral surface of the light-reflective covering member is substantially flush with the second lateral surface of the mounting board.

10. The light-emitting device according to claim 1, wherein
the mounting board defines a hollow on a lower surface of the mounting board at a position opposite to the depressed portion.

11. The light-emitting device according to claim 1, wherein
the light-reflective covering member includes a lateral surface extending along a plane intersecting an alignment direction of the first lands and the second lands, the lateral surface being inclined toward an inside of the light-emitting device relative to a lateral surface of the mounting board extending along the plane intersecting the alignment direction of the first lands and the second lands.

12. The light emitting device according to claim 4, wherein
the depressed portion reaches at least one of the first lateral surface and the second lateral surface of the light reflective covering member in a top view.

13. The light-emitting device according to claim 5, wherein
a linear expansion coefficient of a material for the light-reflective covering member is larger than a linear expansion coefficient of a material for the mounting board.

14. The light-emitting device according to claim 5, wherein
the light-reflective covering member includes
an upper surface,
a lower surface opposite to the upper surface,
a first lateral surface adjacent to the upper surface and the lower surface, and elongated along an alignment direction of the first lands and the second lands,
a second lateral surface opposite to the first lateral surface,
a third lateral surface adjacent to the upper surface, the lower surface and the first lateral surface, and
a fourth lateral surface opposite to the third lateral surface and adjacent to the upper surface, the lower surface and the first lateral surface, and
the mounting board includes
the upper surface,
a lower surface opposite to the upper surface,
the first lateral surface adjacent to the upper surface and the lower surface, and elongated along the alignment direction of the first lands and the second lands,
the second lateral surface opposite to the first lateral surface,
a third lateral surface adjacent to the upper surface, the lower surface and the first lateral surface, and
a fourth lateral surface opposite to the third lateral surface, and adjacent to the upper surface, the lower surface and the first lateral surface.

15. The light-emitting device according to claim 14, wherein
the first lateral surface of the light-reflective covering member is substantially flush with the first lateral surface of the mounting board.

16. The light-emitting device according to claim 5, further comprising:
a first light-transmissive member that is bonded to an upper surface of the first light-emitting element, and that contains a wavelength conversion substance configured to absorb light from the first light-emitting element to emit light; and
a second light-transmissive member that is bonded to an upper surface of the second light-emitting element, and that contains a wavelength conversion substance configured to absorb light from the second light-emitting element to emit light,
wherein the light-reflective covering member covers a lateral surface of the first light-transmissive member and a lateral surface of the second light-transmissive member.

17. The light-emitting device according to claim 5, wherein
the mounting board includes a wiring disposed on a lower surface opposite to the upper surface, and
the first lands and the second lands are connected to the wiring.

18. The light-emitting device according to claim 14, wherein
the first lateral surface of the light-reflective covering member is substantially flush with the first lateral surface of the mounting board, and
the second lateral surface of the light-reflective covering member is substantially flush with the second lateral surface of the mounting board.

19. The light-emitting device according to claim 5, wherein
the mounting board defines a hollow on a lower surface of the mounting board at a position opposite to the depressed portion.

20. The light-emitting device according to claim 5, wherein
the light-reflective covering member includes a lateral surface extending along a plane intersecting an alignment direction of the first lands and the second lands, the lateral surface being inclined toward an inside of the light-emitting device relative to a lateral surface of the mounting board extending along the plane intersecting the alignment direction of the first lands and the second lands.

* * * * *

UNITED STATES PATENT AND TRADEMARK OFFICE
CERTIFICATE OF CORRECTION

PATENT NO. : 10,504,876 B2
APPLICATION NO. : 15/889677
DATED : December 10, 2019
INVENTOR(S) : Takuya Nakabayashi and Tadaaki Ikeda Page 1 of 1

It is certified that error appears in the above-identified patent and that said Letters Patent is hereby corrected as shown below:

On the Title Page

On Page 2, in Item (56) References Cited, under "FOREIGN PATENT DOCUMENTS", Line 3, delete "JP 21013-012545 A 1/2013" and insert -- JP 2013-012545 A 1/2013 --.

Signed and Sealed this
Thirtieth Day of June, 2020

Andrei Iancu
*Director of the United States Patent and Trademark Office*